United States Patent [19]
Dorey, II et al.

[11] Patent Number: 4,574,031
[45] Date of Patent: Mar. 4, 1986

[54] ADDITIVE PROCESSING ELECTROLESS METAL PLATING USING AQUEOUS PHOTORESIST

[75] Inventors: John K. Dorey, II, Ewing Township, Mercer County, N.J.; James T. Huneke, Lower Makefield Township, Bucks County; Bruce S. Madsen, Nockamixon Township, Upper Bucks County, both of Pa.; Theodore F. Schaaf, Lawrence Township, Mercer County, N.J.

[73] Assignee: AT&T Technologies, Inc., Berkeley Heights, N.J.

[21] Appl. No.: 717,813

[22] Filed: Mar. 29, 1985

[51] Int. Cl.$^4$ .................. B44C 1/22; C03C 15/00; B05D 5/12; B29C 17/08

[52] U.S. Cl. .................. 156/655; 156/668; 156/902; 427/96; 427/304; 427/305; 427/307

[58] Field of Search ................. 427/96–98, 427/301, 304, 305, 306, 307, 272; 430/313, 314, 324; 156/655, 668, 902; 174/68.5

[56] References Cited

U.S. PATENT DOCUMENTS

| | | | |
|---|---|---|---|
| 4,042,387 | 8/1977 | Tarakci | 96/36 |
| 4,304,681 | 12/1981 | Martin et al. | 252/143 |
| 4,351,895 | 9/1982 | Walls | 430/331 |
| 4,355,095 | 10/1982 | Cousins | 430/293 |
| 4,388,351 | 6/1983 | Sawyer | 427/304 |

*Primary Examiner*—William A. Powell
*Attorney, Agent, or Firm*—J. F. Spivak

[57] ABSTRACT

In a method for making a printed circuit board employing an aqueous type photoresist and including etching of the substrate surface with chromic acid after application of the photoresist mask, chromium is washed from the surface with a reducing agent at a pH of $\leq 10$.

10 Claims, No Drawings

ADDITIVE PROCESSING ELECTROLESS METAL PLATING USING AQUEOUS PHOTORESIST

TECHNICAL FIELD

This invention relates to forming a metal pattern on a surface of a substrate. More particularly, the present invention relates to methods particularly suitable for the manufacture of high resolution printed circuit boards employing an aqueous type photoresist.

BACKGROUND OF THE INVENTION

It is well known to apply an electroless metal plating to an insulating substrate such as a polymer. Generally, the process involves depositing a noble metal, such as platinum, gold or paladium which acts as an initiator or catalyst for the electroless metal plating onto the surface of the insulating substrate, and then dipping the catalyzed substrate into an electroless metal plating solution. It is also known to catalyze a surface with a non-noble metal catalytic layer, e.g., Cu, by reduction of a copper compound absorbed on the surface.

Various techniques have been proposed to form a circuit on the insulating substrate by electroless metal plating for the manufacture of printed circuits on flexible or rigid substrates. The most common methods employed may be divided into two catagories, subtractive processing and additive processing.

In the subtractive method for forming a circuit pattern on a substrate, the substrate employed has a thin metal layer laminated to its surface. A photoresist pattern is then formed over the metal laminate and the laminate is then treated with an etching solution so as to etch the exposed portions of the metal laminate, leaving metal only in the area protected by the photoresist. This method has several disadvantages among which is the necessity for the use of relatively large quantities of etching solution, undercutting of the metal during etching which prevents formation of high resolution patterns and the waste of base metal which must be etched away and either reclaimed or disgarded. Electroless plating is employed as an adjunct to the subtractive processing when one requires throughholes in the printed circuit board for the mounting of devices or interconnection of circuit patterns from one layer of the board to another. These throughholes must be metalized to insure circuit continuity and/or good adhesion of inserted devices by soldering.

One additive electroless technique involves first sensitizing and activating the entire substrate surface before putting down a resist pattern and then after putting down the resist pattern, the entire surface is treated with the electroless metal deposition solution. In this method metal deposits only on the sensitized and activated exposed substrate areas and not on the resist-covered areas. Resolution is quite good in this method, however, this method has several disadvantages: e.g., (1) sensitization of the substrate surface produces a surface which may have a relatively low resistivity between the deposited conductors (if spacing is to be very close between conductors, as is required in many of todays high density applications, this may cause electrical breakdown); and (2) manufacturing handling problems exist in that the catalytic surface is highly sensitive to contamination, scratching and the like which can result in defective circuits.

An improved additive processing techique was described by Sawyer in U.S. Pat. No. 4,388,351. In accordance with this techique, a negative mask is applied to the surface of the substrate whereby portions of the surface are exposed in a positive manner. Micropores are formed in the positive pattern portions of the substrate surface such as by chemical treatment or sputter etching. The positive pattern portions of the substrate and the negative mask are then sensitized to form catalytic species thereon capable of catalyzing an electroless metal deposition. A thin/porous flash metal deposit having a thickness of, for example, from 0.003 to 0.02 inches is deposited on the delineated catalytic species. The negative mask is then removed, thereby removing the catalytic species and flash electroless metal deposit thereon. This leaves the catalytic species and flash deposit in the desired pattern on the substrate surface. The conductive pattern is built up by electroless deposition onto the flash deposit to a desired thickness.

Generally, in the past, most photoresists used for defining the required circuit patterns have been of the type which require chlorinated hydrocarbon solvents to develop the resist pattern. In recent years, aqueous photoresists have been a subject of intense interest in the printed circuit industry. The most desirable feature of an aqueous photoresist process is that aqueous alkaline solutions are used to develop and strip the resist rather than the chlorinated hydrocarbon solvents which present difficult environmental and health problems. It would therefore, be advantageous to be able to employ an aqueous photoresist in the catalyst lift-off process just mentioned. However, the mere substitution of an aqueous photoresist for non-aqueous photoresist was found to be non-trivial. It was discovered that when the same chemistry was employed in the process as described by Sawyer, except for substitution of the aqueous photoresist for the non-aqueous photoresist, the aqueous photoresist was often undesirably prematurely stripped from the substrate during treatment and further, contaminated the electroless plating bath. We have now discovered that by changing some of the chemical solutions previously employed in the catalyst lift-off process, the integrity of the aqueous photoresist can be maintained and a continuous low cost commercial process has become feasible.

SUMMARY OF THE INVENTION

We have found that a metal pattern can be applied to a substrate, e.g., a circuit pattern to a printed circuit board substrate, by additive processing utilizing an aqueous photoresist in a commercially adaptable, low cost technique.

The processing steps include (a) applying an aqueous alkaline solution soluble negative photoresist mask onto a surface of the substrate whereby portions of the surface are exposed in a positive pattern; (b) treating the substrate with a solvent to cause swelling of the exposed substrate surface; (c) treating the substrate with a chromic acid etching solution so as to form micropores in the swelled substrate surface; (d) treating the substrate in a reducing media at a pH of no greater than 10 so as to reduce and remove the chrome from the surface of the substrate; (e) catalyze the surface of the substrate; (f) electrolessly deposit a thin flash metal deposit from a hypophosphite-type flash electroless plating solution; (g) remove the negative mask and thereby the catalytic species and flash electroless metal deposit thereon to delineate and leave the catalytic species and flash deposit in the desired pattern on the substrate surface and (h) electrolessly deposit a thick metal layer onto the flash deposited pattern.

DETAILED DESCRIPTION

Generally, the novel process comprises first applying an aqueous photoresist to the surface of a substrate. The term aqueous type photoresist means a photoresist that can be developed and stripped using aqueous media, e.g., an aqueous alkaline solution, rather than organic solvents. The photoresist is imaged and developed so as to form a positive pattern of exposed substrate material. The substrate is then treated, e.g., with swelling and etching solutions, to form micropores therein which aid in increasing the degree of adhesion of the finally deposited metallic circuit to the substrate. Subsequent to this etching step, which is generally accomplished by means of a chromic acid etch, the chromium which tends to remain on the surface of the substrate must be substantially removed. Removal of the chromium is accomplished by treating the substrate with a reducing agent and/or rinsing agent. We have found that to preserve the integrity of the mask, these agents must be at a pH of $\leq 10$, including acidic agents. Thereafter, the surface of the substrate is catalyzed by means of well known catalytic solutions and the substrate is then exposed to a flash electroless plating bath so as to deposit a very thin, porous flash metallic coating thereon. The photoresist is then stripped from the substrate together with any catalytic or flash metal deposits which overlie the photoresist. This now leaves the deposited circuit pattern in the form of a flash electroless coating on the substrate. The substrate is then treated in a full build electroless plating bath or alternatively may be electroplated.

The above general procedure is essentially the same as the procedure previously used except that when one employs an aqueous type photoresist, it was found that the solutions which were previously used to remove chrome from the surface of the substrate and the previously employed flash electroless deposit solution, caused the photoresist to be prematurely stripped or eroded from the substrate and contaminated the flash electroless bath.

We have now discovered that the reason for the problem in accordance with the prior art method was the high pH of the highly caustic sodium hydroxide solutions employed in the chrome removal step and the alkaline formaldehyde-type flash electroless plating bath previously used. The aqueous photoresist was attacked by these high pH solutions. We have now discovered that as long as the solutions employed are at a pH of 10 or less, attack of the photoresist can be eliminated or minimized so as not to have any detrimental effect on the overall process.

Accordingly, we have discovered that by employing as a chrome removal treatment the use of a reducing agent such as sodium bisulfite or hydrazine, especially in an acidic environment, e.g., in HCl, the chromium ions on the surface can be reduced and removed from the substrate. Further, by substituting a hypophosphite-type of flash electroless plating bath for the more commonly employed formadehyde-type bath, stripping of the photoresist during the electroless plating step can also be substantially eliminated.

Describing the invention in greater detail, a commerical FR4 panel as is well known in the industry as a substrate for printed circuit boards is coated with a rubber modified epoxy coating. Such coatings are also known in the art and provide a better surface for deposition on the panel. The epoxy coated surface is then treated in dimethylformamide so as to swell the surface. Typically a 69 percent dimethylformamide solution which is heated somewhat above room temperature is suitable. After rinsing in distilled water, the surface is etched with a chromic acid-sulfuric acid etch solution so as to form the desired micropores on the surface. The board is then rinsed and treated either first with a sodium metabisulfite solution so as to reduce chromium ions on the board from CR(VI) to CR(III) and subsequently treating with 30 percent hydrochloric acid solution or alternatively, the chromium may be removed by treating with a solution comprising hydrazine in about 10 percent hydrochloric acid. This latter solution is sold commercially by MacDermid Corporation and is known as MacDermid 9080. After a final water rinse, the surface is catalyzed such as with commerical catalyst MacDermid 9070. The substrate may then be treated with an accelerator, if desired, and then placed in a flash electroless copper solution such as MacDermid's 249-T plating solution which is a hypophosphite-type, formaldehyde-free alkaline plating solution having a pH of about 9. Subsequent to the flash plating, the photoresist is stripped by treatment in 3N sodium hydroxide solution and the circuit board is thereafter rinsed before placing it into a full build electroless bath or electroplating bath.

Suitable photoresists of the aqueous type are Grace Accutrac ™ aqueous photoresist #2314 and #2491. It is believed that these photoresists are acrylate modified urethanes. These photoresist are of the liquid type. Aqueous type dry film resists are also available in the market. However, the liquid type photoresists are preferred. Imaging of the liquid photoresist is best done by off contact printing techniques. It was found to be preferred to give these liquid resists a post-development Uv cure to prevent attack during subsequent swell-etching and flash plating steps. This extra exposure was an addition to normal exposure employed for primary development of the desired image pattern. Typically, primary image development employs an energy density of from about 150–200 mJ/cm$^2$ while the post-development cure employs from 1–2 J/cm$^2$.

With regard to the removal of chrome ions from the surface of the etched substrate, it may be noted that any solution or solutions which will remove chrome at a pH of 10 or less would be suitable. This is based upon our discovery that the aqueous photoresist is relatively stable in the presence of solutions of pH's of 10 or less including acidic solutions.

The flash electroless plating bath which was most commonly used in the prior art is a hydroxide catalyzed formaldehyde reducing agent containing bath. This bath, while run at room temperature, has a pH of 13 and is therefore not suitable for use with a liquid photoresist as the resist is attacked by the alkaline bath solution. This leads not only to premature removal of the resist, but also to electroless bath instability. The aforementioned preferred formaldehyde-free flash electroless bath which exhibits a pH of 9 is preferably operated at a temperature of about 74° C. A recommended accelerator for use prior to flash plating is a MacDermid 2493-T accelerator which solution is also at pH 9. Acid accelerators such as 30 percent HCl can also be employed.

Any standard commercial catalysts such as MacDermid 9070 or Mactivate-10 are suitable for use in catalyzing the substrate surface.

It is important to note that it is recognized that a caustic rinse, e.g., with a 3N–4N NaOH solution, especially if neutralized thereafter with an HCl rinse is most efficient for chrome removal. However, as pointed out, such a rinse is detrimental to the aqueous type resist. While chrome ion removal is not as efficient when using the novel procedure set forth herein, it is nevertheless more than sufficient to maintain high peel strengths and low surface resistivity. The following table (Table I) shows the average results of various experiments to remove chrome from the surface subsequent to the swelling and etching of the surface. Wherever a "rinse" is indicated, this is a deionized water rinse. The term '9080' appearing in the Table refers to a 5% solution of MacDermid's 9080 hydrazine-HCl concentrate together with 3% concentrated HCl.

TABLE I

| Chrome Removal Procedure | Relative Quantity of Chrome Remaining, % |
|---|---|
| 1. Rinse | 100 |
| 2. Rinse-Rinse-Rinse-Rinse | 75 |
| 3. Rinse-Na$_2$S$_2$O$_5$-Rinse | 71 |
| 4. Rinse-Na$_2$S$_2$O$_5$-Rinse-NaOH-Rinse | 54 |
| 5. Rinse-9080-Rinse | 54 |
| 6. Rinse-Na$_2$S$_2$O$_5$-Rinse-9080-Rinse | 44 |
| 7. Rinse-HCl-Rinse | 40 |
| 8. Rinse-NaOH-Rinse-9080-Rinse | 35 |
| 9. Rinse-NaOH-Rinse | 31 |
| 10. Rinse-9080-Rinse-HCl-Rinse | 31 |
| 11. Rinse-Na$_2$S$_2$O$_5$-Rinse-HCl-Rinse | 29 |
| 12. Rinse-NaOH-Rinse-HCl-Rinse | 12 |

(a)Na$_2$S$_2$O$_5$ solutions were 40/g/l concentrations used at room temperature;
(b)NaOH solutions were 3 Normal used at 50° C.;
(c)MacDermid 9080 hydrazine solutions were diluted to form a 5% solution with an additional 3% of concentrated HCl added and used at 42° C.; and
(d)HCl solutions were 4 Normal and used at room temperature.

Table II shows the quantity of chromium, tin and palladium on the surface after etching the surface at 60° C. with a 150g/l CrO$_3$ solution in 10.2N H$_2$SO$_4$ (High) and at 40° C. with a 100 g/l CrO$_3$ solution in 11N H$_2$SO$_4$ and then treating the surface with various chrome removal solutions. Chrome levels were determined after treatment with the chrome removal solutions indicated. Sn and Pd levels were determined after catalyzation with a MacDermid 249-T catalyst solution. Also shown are the thicknesses of copper attained after exposure to a MacDermid 9080 copper electroless plating bath and the peel strength of the copper in lbs/in.

TABLE II

| Etch | Chrome Removal | Cr, g/cm | Sn, g/cm | Pd, g/cm | Cu, in | Peel lbs/in |
|---|---|---|---|---|---|---|
| High | None | .32* | 0.0 | 0.0 | 0.0 | — |
| High | NaOH | .13 | 3.33 | 2.93 | 12.68 | 14.7 |
| High | NaSO/HCl | .19 | 3.08 | 2.56 | 7.03 | 15.0 |
| High | 9080 | .15 | 3.14 | 2.69 | 10.60 | 14.7 |
| High | 9080/HCl | .13 | 3.42 | 2.74 | 11.65 | 14.4 |
| Low | None | 1.02* | 0.0 | 0.0 | 0.0 | — |
| Low | NaOH | .49 | 6.55 | 5.00 | 25.20 | 9.1 |
| Low | NaSO/HCl | .72 | 5.11 | 3.63 | 9.32 | 10.1 |
| Low | 9080 | .55 | 5.47 | 4.60 | 19.60 | 9.6 |
| Low | 9080/HCl | .53 | 5.32 | 4.49 | 19.57 | 10.4 |

*Unprocessed E500 used as blank.

As can be seen from the Table, the presence of high amounts of chrome, e.g., with the untreated samples, results in no catalyst deposition and hence, no plating. Further, treatment with the hydrazine or sodium bisulfite solutions results in copper plating and peel strengths equivalent to that of NaOH treatment. Hence, these chrome removal solutions which are compatible with aqueous photoresists do not adversely effect the quality of the copper deposit.

What is claimed is:

1. A method for making a printed circuit including the steps of:
   (a) applying a photoresist mask to the surface of a substrate to delineate the desired pattern, said photoresist being soluble in an aqueous alkaline solution of pH >10;
   (b) treating the substrate with a chromic acid solution so as to etch the exposed substrate surface;
   (c) washing the substrate in a reducing media having a pH of ≦10 so as to reduce and remove chrome from the surface;
   (d) catalyze the surface of the substrate; and
   (e) electrolessly deposit a thin flash metal deposit from a hypophosphite type flash electroless plating solution.

2. The method recited in claim 1, wherein the substrate is swelled by treatment with a swellant solution prior to etching.

3. The method recited in claim 2, wherein the substrate surface comprises an epoxy resin, the swellant is dimethylformamide and the chromic acid solution comprises chromium trioxide in sulfuric acid.

4. The method recited in claim 1, including the steps of stripping the photoresist mask subsequent to flash plating whereby any catalyst and flash plate overlying said mask are removed with the mask thereby leaving a flash plate pattern on the remaining portions of the substrate and subsequently plating additional conductor over the flash plate to a predetermined thickness.

5. The method recited in claim 4, wherein the subsequent plating over the flash plate is by means of electroless plating.

6. The method recited in claim 1, wherein the reducing media comprises a solution of sodium bisulfite.

7. The method recited in claim 1, wherein washing is performed by treatment with a sodium bisulfite reducing solution followed by rinsing with an HCl solution.

8. The method recited in claim 1, wherein the reducing media is a hydrazine solution.

9. The method recited in claim 8, wherein the hydrazine is mixed with HCl.

10. The method recited in claim 9, wherein washing includes an HCl solution rinse subsequent to treatment with the hydrazine solution.

* * * * *